US006215125B1

(12) United States Patent
Chen et al.

(10) Patent No.: US 6,215,125 B1
(45) Date of Patent: Apr. 10, 2001

(54) METHOD TO OPERATE $GEF_4$ GAS IN HOT CATHODE DISCHARGE ION SOURCES

(75) Inventors: Jiong Chen, Beverly; Brian S. Freer, Medford; John F. Grant, Beverly, all of MA (US); Lawrence T. Jacobs, Jericho; Joseph L. Malenfant, Jr., Colchester, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/154,426

(22) Filed: Sep. 16, 1998

(51) Int. Cl.[7] .............................. H01J 27/00; H01J 37/30

(52) U.S. Cl. ................................ 250/452.21; 250/423 R; 315/111.81

(58) Field of Search .............................. 250/492.21, 398, 250/423 R; 315/111.81

(56) References Cited

U.S. PATENT DOCUMENTS

| | | | | |
|---|---|---|---|---|
| 4,881,010 | * | 11/1989 | Jetter | 315/111.81 |
| 5,306,921 | | 4/1994 | Tanaka et al. | 250/492.21 |
| 5,563,418 | | 10/1996 | Leung | 250/492.21 |
| 5,640,020 | * | 6/1997 | Murakoshi et al. | 250/492.21 |
| 5,656,820 | | 8/1997 | Murakoshi et al. | 250/492.21 |

* cited by examiner

*Primary Examiner*—Bruce C. Anderson
(74) *Attorney, Agent, or Firm*—Scully, Scott, Murphy & Presser; William D. Sabo, Esq.

(57) ABSTRACT

The present invention provides a method of extending, i.e. prolonging, the operating lifetime of hot cathode discharge ion source by utilizing and introducing a nitrogen-containing co-bleed gas into an ion implantation apparatus which contains at least a hot cathode discharge ion source and an ion implantation gas such as $GeF_4$.

25 Claims, 2 Drawing Sheets

METHOD TO OPERATE $GeF_4$ GAS IN HOT CATHODE DISCHARGE ION SOURCES

DESCRIPTION

1. Field of the Invention

The present invention relates to ion implantation, and in particular to a method for extending the lifetime of a hot cathode discharge ion source which is utilized in an ion implantation apparatus to generate source ions.

2. Background of the Invention $Ge^+$ion implants have been widely used in the semiconductor industry to pre-amorphize silicon wafers in order to prevent channeling effects. The demands for these pre-amorphizing implants are expected to increase greatly in future semiconductor device manufacturing. The most popular ion feed gas for $Ge^+$beams is $GeF_4$, because of its stable chemical properties and cost effectiveness. However, very short lifetimes, on the order of 12 hours or less, of the hot cathode discharge ion sources have been observed while operating with $GeF_4$ gas.

The common source failure mode is that some materials deposit on the cathode surfaces of the hot cathode discharge ion source during extended use of the ion implantation apparatus. This deposition reduces the thermionic emission rate of the source ions from the hot cathode surfaces. Consequently, the desired arc currents can not be obtained and the hot cathode discharge sources have to be replaced in order to maintain normal source operation. The short source life greatly reduces the productivity of an ion implanter.

The cause of the short source life in $GeF_4$ ion implantation is believed to be excessive, free fluorine atoms in the ion source due to the chemical dissociation of $GeF_4$ molecules. The arc chamber material is etched away by chemical reaction of the fluorine atoms with the material of the arc chamber. Some of the arc chamber material may eventually deposit on the hot cathode resulting in the degradation of electron emissions from the hot cathode discharge source.

Other implantation gases besides $GeF_4$ are employed in ion implantation and these other gases may cause the same shortening of the lifetime of the hot cathode discharge ion source. The term "hot cathode discharge ion source" is used herein to denote any thermionic emission element which when heated to a temperature of at least 1200° C. emits desired electrons. It is noted that the exact temperature wherein electrons are emitted from such elements is dependent on the material of the element.

A typical prior art ion implantation apparatus, i.e. tool, is illustrated in FIG. 1. Specifically, the prior art ion implantation apparatus comprises an ion source chamber 10 which generates ions to be implanted into a desired substrate. The generated ions are drawn by drawing electrodes 12 and their mass is analyzed by a separating electromagnet 14. After mass analysis, the ions are completely separated by slits 16 and the appropriate ions are accelerated by accelerators 18 to a final energy. A beam of ions is converged on the face of a sample or substrate 20 by a quadrupole lens 21 and scanned by scanning electrodes 22*a* and 22*b*. Deflection electrodes 24, 26 and 28 are designed to deflect the ion beam in order to eliminate uncharged particles caused by collision with residual gas.

The ion source chamber 10 is the heart of the ion implantation tool. Five different kinds of ion source chambers are currently known including: a Freeman-type ion source chamber using thermoelectrodes; a Bernas-type ion source chamber; indirectly heated cathode type ion source; microwave type ion source chamber using magnetrons; and RF sources. It should be understood that the terms "ion source" and "hot cathode discharge ion source" are used interchangeably herein.

In order to better understand the present invention, a brief description of a Freeman-type ion source, a Bernas-type ion source and a microwave type ion source is given herein. The other types of ions sources mentioned hereinabove, i.e. indirectly heated cathode and RF, are not illustrated herein, but are also well known to those skilled in the art.

FIG. 2 is a cross-sectional view of a Freeman-type ion source chamber 10. Specifically, in this ion source, plasma is generated by emitting thermoelectrons from a bar-shaped filament 30, an electrical field is generated parallel to filament 30 by an electromagnet 32, a rotating field is caused by filament current, and electrons are moved in the chamber by a reflector 34, thereby improving the efficiency in ionization. The ions generated in the chamber pass through slit 36 and are guided in a direction perpendicular to the filament.

FIG. 3 is a cross-sectional view of a Bernas-type ion source chamber 10 containing molybdenum (Mo) as the main ingredient. The ion source chamber 10 includes a tungsten (W) filament 40 and its opposing electrode 44. The ion source chamber is supplied with the desired gas from gas line 46 and emits thermoelectrons from the filament.

A typical microwave ion source is shown in FIG. 4. Specifically, in this chamber 10, plasma is generated in a discharge box 50 using a microwave caused by magnetron 52. Since this chamber has no filaments, its lifetime is not shortened even by the use of reactive gases. However, metal as well as ions are extracted from the chamber and are attracted to the surfaces of drawing electrodes 54; therefore, a desired voltage cannot be applied or the metal or ions may reach a sample to contaminate it.

Each of the above described ion sources exhibits the problem mentioned hereinabove. Prior art solutions to the short lifetime problem exhibited by these hot cathode discharge ion sources involve either changing of the hot cathode discharge ion source itself or coating the interior walls of the ion implantation apparatus with a material that is resistant to chemical attack. The latter solution is described, for example, in U.S. Pat. No. 5,656,820 to Murakoshi, et al.

Despite the success of such prior art processes, there exists a need to develop a new and improved method of extending the lifetime of hot cathode discharge ion sources. Such a method is needed since the prior art solutions are either too time consuming or add additional operating costs to the overall process. The prior art solution also yields an unwanted contaminant into the substrate when implanting a $BF_2$ species (Nb).

SUMMARY OF THE INVENTION

One object of the present invention is to provide a simple, yet cost effective method for extending the lifetime of a hot cathode discharge ion source which is typically employed in the prior art to implant ions into a substrate.

Another object of the present invention is to provide a method which significantly reduces the time required to shut down the ion implantation apparatus to either replace the discharge source or to coat the interior walls of the apparatus thus providing improved productivity to the ion implanter operator.

A still further object of the present invention is to prolong the lifetime of a hot cathode discharge ion source when fluorine-containing gases such as $GeF_4$ are employed as the implantation, i.e. ion source, gas.

These as well as other objects and advantages can be achieved in the present invention by introducing a nitrogen-containing gas, as a co-bleed gas, into an ion source chamber containing at least an implantation gas and a hot cathode discharge ion source. The method of the present invention is particularly applicable for use in ion implantation apparatuses wherein highly fluorinated gases such as $GeF_4$ are employed as the implantation gas. The term "highly fluorinated" is used herein to denote a gaseous compound which contains more than a single molecule of fluorine. It has been observed that a 50 to about 120 hour improvement in the lifetime of the hot cathode ion source can be obtained when a nitrogen-containing gas is used in conjunction with $GeF_4$ source gas. Similar improvements are expected to be observed with other implantation gases.

DETAILED DESCRIPTION OF THE INVENTION

Figure 1:
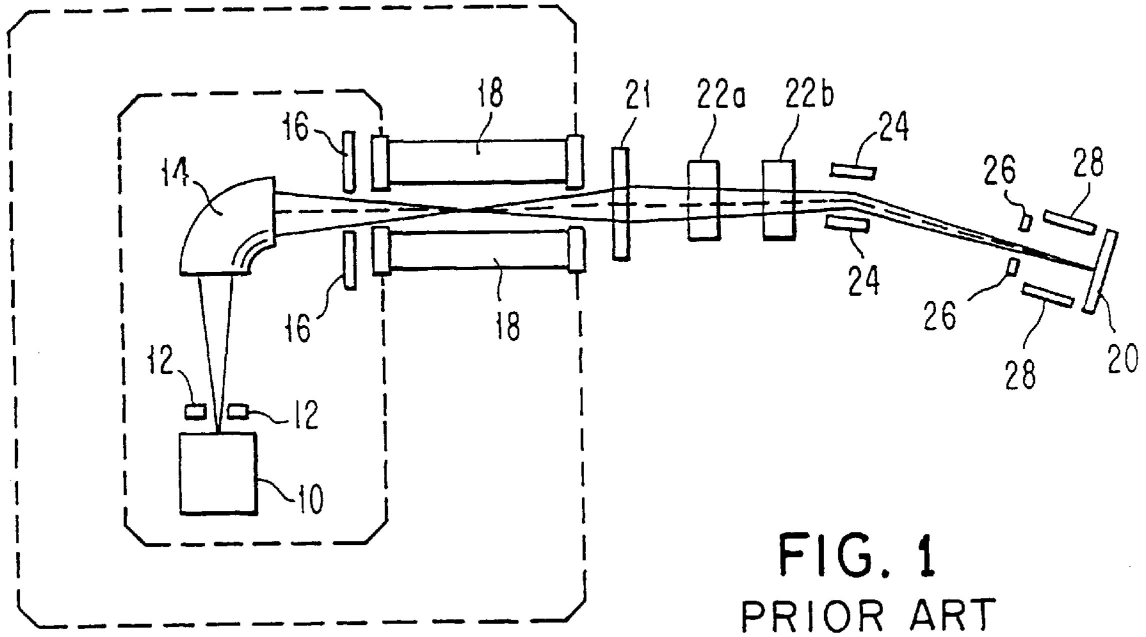
FIG. 1 PRIOR ART
FIG. 1 is a cross-sectional view of a typically prior art ion implantation apparatus that can be employed in the present invention.

The present invention, which provides a method for extending, i.e. prolonging, the lifetime of a hot cathode discharge ion source used in ion implantation, will now be described in greater detail with reference to the accompanying drawings wherein like reference numerals are used for describing like and corresponding elements and/or components of the drawings. It is noted that the present invention is not limited to the use of any one type of ion implantation apparatus or hot cathode discharge ion source. Instead, the method of the present invention is applicable for use with the ion implantation apparatus shown in FIG. 1 as well as any other type of ion implantation apparatus now known to those skilled in the art or those that will be developed in the future.

Figure 2:
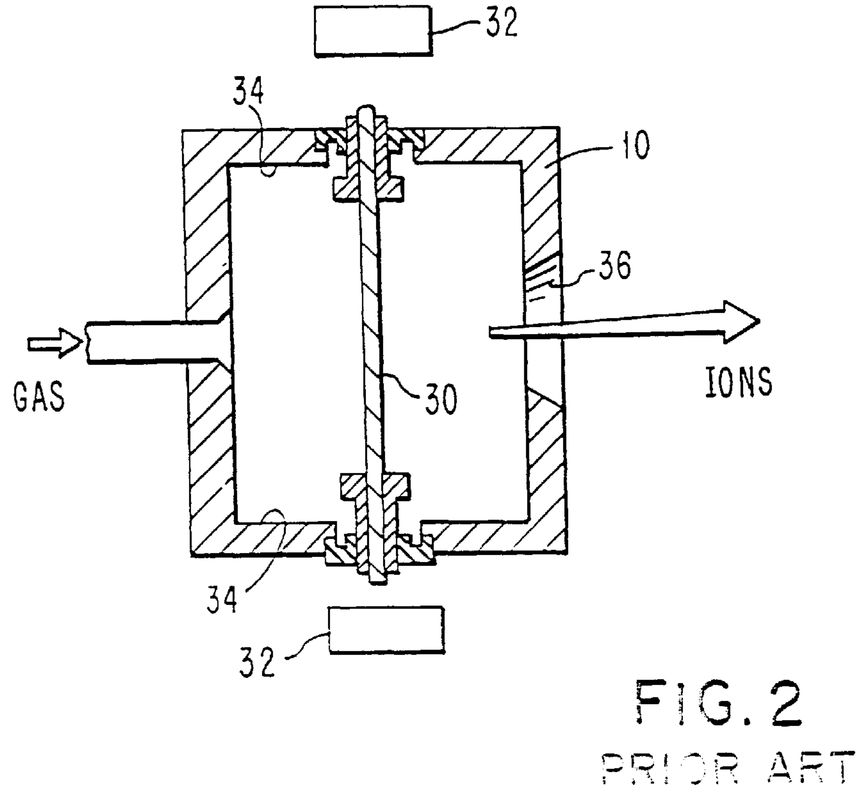
FIG. 2 PRIOR ART
FIG. 2 is a cross-sectional view showing the various components of a prior art Freeman-type ion source.
Figure 3:
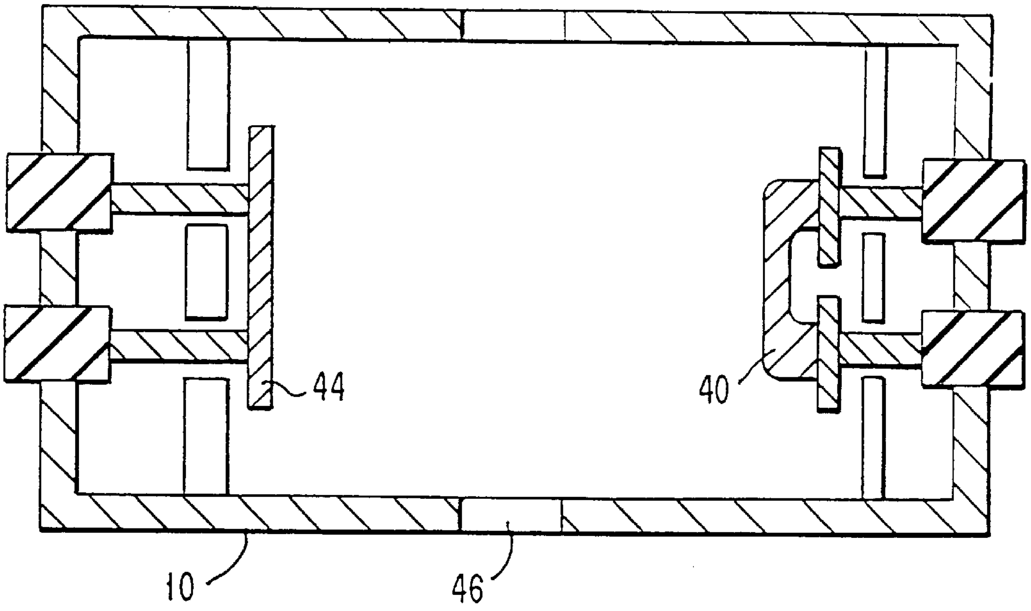
FIG. 3 PRIOR ART
FIG. 3 is a cross-sectional view showing the various components of a prior art Bernas-type ion source.
Figure 4:
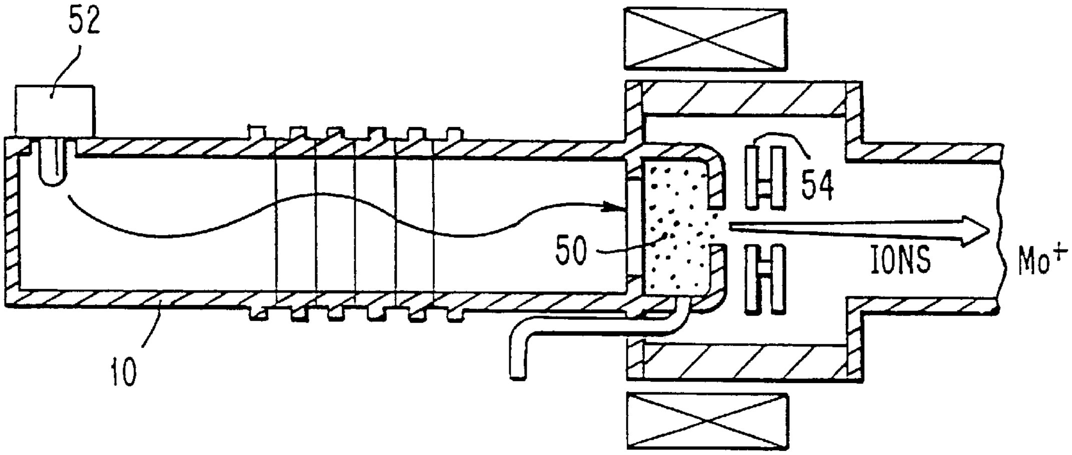
FIG. 4 PRIOR ART
FIG. 4 is a cross-sectional view showing the various components of a prior art microwave ion source.

Additionally, the method of the present invention can be used with any type of hot cathode discharge ion source including, but not limited to: the Freeman-type ion source as previously described and shown in FIG. 2, the Bernas-type ion source as previously described and shown in FIG. 3; the microwave ion source as previously described and shown in FIG. 4; an indirectly heated cathode type ion source; and a RF ion source.

According to the method of the present invention, extended lifetime of the hot cathode discharge ion source can be obtained by introducing a nitrogen-containing gas as a co-bleed gas into an ion source chamber which contains at least a hot cathode discharge ion source and an implantation gas.

The term "co-bleed" is used herein to denote that the nitrogen-containing gas and the implantation gas are introduced into the ion source chamber of the ion implantation apparatus at substantially the same time. The aforementioned gas co-bleed is maintained throughout the entire ion implantation process and the implantation process is operated using conventional ion implantation conditions that are well known to those skilled in the art.

Suitable nitrogen-containing gases that can be employed in the present invention include, but are not limited to: nitrogen, air (dry or wet), $NF_3$, NO, $N_2O$, $NO_3$, $N_2O_3$, $NO_3F$, NOBr, NOF, $NO_2F$ and mixtures thereof. Of these nitrogen-containing gases, nitrogen gas is highly preferred in the present invention.

In accordance with one preferred embodiment of the present invention, the concentration of the co-bleed gases is from about 20 to about 80 parts of the ion implantation gas to about 80 to about 20 parts of nitrogen-containing gas. More preferably, the concentration of the co-bleed gases is from about 30 to about 50 parts of the ion implantation gas to about 70 to about 50 parts of nitrogen-containing gas. The flow rate of the co-bleed gases is controlled by conventional gas flow meters or other means well known to those skilled in the art.

The nitrogen-containing gas employed in the present invention can be a high purity or low purity gas. When a high purity nitrogen-containing gas is employed, the purity of the nitrogen-containing gas is greater than about 50%. More preferably the nitrogen-containing gas employed in the present invention has a purity of from about 90 to about 100%. The nitrogen-containing gas may have the desired purity or it can be purified to a predetermined level by utilizing gas purification techniques, including scrubbers, well known to those skilled in the art.

Suitable ion implantation gases, i.e. source gases, that can be employed in conjunction with the nitrogen-containing co-bleed include, but are not limited to: fluorinated gases such $GeF_4$, $SiF_4$, $Si_2F_6$, $SF_6$, $S_2F_6$ and $SF_4$ as well as other gases such as $AsH_4$ and $PH_3$. A highly preferred ion implantation gas that can be used in conjunction with a nitrogen-containing gas is $GeF_4$.

It is again emphasized that the use of the present invention, i.e. co-bleed gases, extends, i.e. prolongs, the lifetime of currently used hot cathode discharge ion source to times heretofore unobtainable in the prior art. For example, in current ion implantation technology which does not employ the method of the present invention, the lifetime of a molybdenum hot cathode discharge ion source is from about 12 to about 30 hours when operating with $GeF_4$. By employing the method of the present invention, the Mo hot cathode discharge ion source's lifetime improves to about 80 to about 150 hrs. Such an improvement, which is on the order of 400 to about 750%, represents a significant advance in the ion implantation industry since it reduces the shutdown time one would require to repair the tool. Moreover, by employing the method of the present invention, the ion source exhibits a very stable lifetime performance as compared to an ion source which is not treated with the co-bleed gases.

The method of the present invention is suitable for use in a wide range of applications wherein ion implantation is required. The method of the present invention is however extremely applicable for use in the semiconductor industry to provide a semiconductor wafer, chip or substrate with source/drain regions or to pre-amorphize the semiconductor wafer of substrate.

The following example is given to illustrate the scope of the present invention. Because this example is given for illustrative purposes only, the invention embodied herein should not be limited thereto.

EXAMPLE

In this example, the effects of using nitrogen as a co-bleed gas were investigated using $GeF_4$ as the source gas and comparison was made to systems wherein no nitrogen co-bleed was employed. For this investigation, a Bernas-type ion source and an indirectly heated cathode (ELS) ion source were used. The ratio of co-bleed gases used in these experiments were 3 parts $N_2$ to 2 parts Ge. The hot cathode ion sources were run using conventional conditions well known for each type of ion source.

The results of these experiments are shown in Table 1. Specifically, the data clearly shows that the use of the co-bleed of nitrogen and $GeF_4$ significantly extends the lifetime of the hot cathode ion source as compared with experiments performed using only $GeF_4$. In all cases, a significant improvement in the lifetime of the hot cathode ion source was observed when nitrogen was used in conjunction with $GeF_4$.

TABLE 1

| Test # | No $N_2$ Co-Bleed | No $N_2$/Arc V > 93V | $N_2$ Co-Bleed (3:2 ratio) |
|---|---|---|---|
| | In-directly Heated Cathode Source (ELS) Life Time Data | | |
| 1 | 12 Hrs | N/A | 136 Hrs |
| 2 | 18 Hrs | N/A | 141 Hrs |
| 3 | 16 Hrs | N/A | 144 Hrs |
| 4 | 20 Hrs | N/A | 148 Hrs |
| 5 | 20 Hrs | N/A | 140 Hrs |

The in-directly heated (ELS) source life tests were run using 100% Ge beams

| Test # | No $N_2$ Co-Bleed | No $N_2$/Arc V > 93V | $N_2$ Co-Bleed (3:2 ratio) |
|---|---|---|---|
| | Bernas (IAS) Source Life Data | | |
| 1 | 12 Hrs | 24 Hrs | 40 Hrs |
| 2 | 15 Hrs | 20 Hrs | 38 Hrs |
| 3 | 20 Hrs | 30 Hrs | N/A |
| 4 | 16 Hrs | 27 Hrs | N/A |

Bernas Source Life testing was done with 6 Hrs of Ge operation then switch $PH_3$ then repeat.
The first two tests did not fail, test had to stop at 40 and 38 hours respectively because of other priorities.

While the invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new, and desire to secure by the Letters Patent is:

1. A method comprising co-bleeding a nitrogen-contianing gas and an implantation gas into an ion source chamber of an ion implantation apparatus, said ion source chamber containing at least a hot cathode discharge ion source; and conducting ion implantation while maintaining said co-bleeding throughout said entire ion implantation, wherein said co-bleeding improves the lifetime of said hot cathode discharge ion source.

2. The method of claim 1 wherein said hot cathode discharge ion source is any thermionic emission element which when heated to temperatures above 1200° C. emits electrons.

3. The method of claim 2 wherein said hot cathode discharge ion source is selected from the group consisting of a Freeman-type ion source, a Bernas-type ion source, an indirectly heated cathode source, a microwave ion source and a RF source.

4. The method of claim 1 wherein said ion implantation gas is a fluorinated gas selected from the group consisting of $GeF_4$, $SiF_4$, $Si_2F_6$, $SF_6F_6$, $S_2F_6$ and $SF_4$.

5. The method of claim 4 wherein said ion implantation gas is $GeF_4$.

6. The method of claim 1 wherein said ion implantation gas is $AsH_4$ or $PH_3$.

7. The method of claim 1 wherein said nitrogen-containing gas is selected from the group consisting of nitrogen, air (dry or wet), $NF_3$, NO, $N_2O$, $NO_3$, $N_2O_3$, $NO_3F$, NOBr, NOF, $NO_2F$ and mixtures thereof.

8. The method of claim 7 wherein said nitrogen-containing gas is nitrogen.

9. The method of claim 1 wherein said co-bled gases are introduced at a concentration of from about 20 to about 80 parts of said ion implantation gas to about 80 to about 20 parts of said nitrogen-containing gas.

10. The method of claim 9 wherein said concentration is from about 30 to about 50 parts of said ion implantation gas to about 70 to about 50 parts of said nitrogen-containing gas.

11. The method of claim 1 wherein said nitrogen-containing containing gas has a purity of greater than 50%.

12. The method of claim 11 wherein said nitrogen-containing gas has a purity of from about 90 to about 100%.

13. The method of claim 1 wherein said co-bleed is maintained through the entire ion implantation operation.

14. A method comprising co-bleeding a nitrogen-containing gas and a fluorinated gas into an ion source chamber of an ion implantation apparatus, said ion source chamber containing at least a hot cathode discharge ion source; and conducting ion implantation while maintaining said co-bleeding throughout said entire ion implantation, wherein said co-bleeding improves the lifetime of said hot cathode discharge ion source.

15. The method of claim 14 wherein said hot cathode discharge ion source is any thermionic emission element which when heated to temperatures above 1200° C. emits electrons.

16. The method of claim 15 wherein said hot cathode discharge ion source is selected from the group consisting of a Freeman-type ion source, a Bernas-type ion source, an indirectly heated cathode source, microwave ion source and a RF source.

17. The method of claim 14 wherein said fluorinated gas is selected from the group consisting of $GeF_4$, $SiF_4$, $Si_2F_6$, $SF_6$, $S_2F_6$ and $SF_4$.

18. The method of claim 17 wherein said fluorinated gas is $GeF_4$.

19. The method of claim 14 wherein said nitrogen-containing gas is selected from the group consisting of nitrogen, air (dry or wet), $NF_3$, NO, $N_2O$, $NO_3$, $N_2O_3$, $NO_3F$, NOBr, NOF, $NO_2F$ and mixtures thereof.

20. The method of claim 19 wherein said nitrogen-containing gas is nitrogen.

21. The method of claim 14 wherein said co-bled gases are introduced at a concentration of from about 20 to about 80 parts of said ion implantation gas to about 80 to about 20 parts of said nitrogen-containing gas.

22. The method of claim 21 wherein said concentration is from about 30 to about 50 parts of said ion implantation gas to about 70 to about 50 parts of said nitrogen-containing gas.

23. The method of claim 14 wherein said nitrogen-containing has a purity of greater than 50%.

24. The method of claim 23 wherein said nitrogen-containing gas has a purity of from about 90 to about 100%.

25. The method of claim 14 wherein said co-bleed is maintained through the entire ion implantation operation.

* * * * *

UNITED STATES PATENT AND TRADEMARK OFFICE
CERTIFICATE OF CORRECTION

PATENT NO. : 6,215,125 B1
DATED : April 10, 2001
INVENTOR(S) : J. Chen et al.

It is certified that error appears in the above-identified patent and that said Letters Patent is hereby corrected as shown below:

Title page,
Item [54], Title, "$GEF_4$" should read -- $GeF_4$ --

Column 5,
Line 64, "$SF_6F_6$" should read -- $SF_6$ --

Column 6,
Line 60, "containing has" should read -- containing gas has --

Signed and Sealed this

Fifteenth Day of October, 2002

*Attest:*

JAMES E. ROGAN

*Attesting Officer* *Director of the United States Patent and Trademark Office*